(12) United States Patent
Hong

(10) Patent No.: US 11,152,305 B1
(45) Date of Patent: Oct. 19, 2021

(54) SEMICONDUCTOR DEVICE AND METHOD OF MANUFACTURING THE SAME

(71) Applicant: Winbond Electronics Corp., Taichung (TW)

(72) Inventor: Wei-Che Hong, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/933,948

(22) Filed: Jul. 20, 2020

(51) Int. Cl.
| | | |
|---|---|---|
| *H01L 23/532* | (2006.01) | |
| *H01L 43/12* | (2006.01) | |
| *H01L 45/00* | (2006.01) | |
| *H01L 23/522* | (2006.01) | |
| *H01L 27/1159* | (2017.01) | |
| *H01L 27/24* | (2006.01) | |
| *H01L 43/02* | (2006.01) | |
| *H01L 27/22* | (2006.01) | |

(52) U.S. Cl.
CPC .... *H01L 23/53238* (2013.01); *H01L 23/5226* (2013.01); *H01L 27/1159* (2013.01); *H01L 27/222* (2013.01); *H01L 27/24* (2013.01); *H01L 43/02* (2013.01); *H01L 43/12* (2013.01); *H01L 45/06* (2013.01); *H01L 45/1233* (2013.01); *H01L 45/16* (2013.01)

(58) Field of Classification Search
CPC .......... H01L 23/53238; H01L 23/5226; H01L 27/1159; H01L 27/222; H01L 27/24; H01L 43/02; H01L 43/12; H01L 45/06; H01L 45/1233; H01L 45/16

USPC ......................................................... 257/288
See application file for complete search history.

(56) References Cited

U.S. PATENT DOCUMENTS 10,840,432 B2 * 11/2020 Wang ...................... H01L 43/02
2015/0021779 A1    1/2015 Liou et al.

FOREIGN PATENT DOCUMENTS

| JP | 2006179645 | 7/2006 |
| TW | 419831 | 1/2001 |
| TW | 200727452 | 7/2007 |
| TW | 201904003 | 1/2019 |

OTHER PUBLICATIONS

"Office Action of Taiwan Counterpart Application", dated Dec. 9, 2020, pp. 1-6.

* cited by examiner

*Primary Examiner* — Tu-Tu V Ho
(74) *Attorney, Agent, or Firm* — JCIPRNET

(57) ABSTRACT

Provided is a semiconductor device including a dielectric layer, a first via, a second via, a first barrier layer, and a second barrier layer. The dielectric layer has a first region and a second region. The first via is disposed in the dielectric layer in the first region. The second via is disposed in the dielectric layer in the second region. The first barrier layer lines a sidewall and a bottom surface of the first via. The second barrier layer lines a sidewall and a bottom surface of the second via. The first and second barrier layers each has an upper portion and a lower portion. The upper portion has a nitrogen doping concentration greater than a nitrogen doping concentration of the lower portion. A method of manufacturing a semiconductor device is also provided.

20 Claims, 11 Drawing Sheets

SEMICONDUCTOR DEVICE AND METHOD OF MANUFACTURING THE SAME

BACKGROUND OF THE INVENTION

Field of the Invention

The present invention relates to a semiconductor device and a method of manufacturing the same.

Description of Related Art

With the advancement of semiconductor technology, current integrated chips include tens of thousands of semiconductor devices. The semiconductor device may include an active device (e.g., transistor, diode, etc.), a passive device (e.g., capacitor, resistor, etc.), or a combination thereof. Metal-insulator-metal (MIM) structure is a common passive device, which is often integrated into the interconnect in the back-end-of-the-line (BEOL) of the integrated chip, so as to be electrically connected to the transistor in the front-end-of-the-line (FEOL).

However, when defining the MIM structure, the exposed vias and/or barrier layers will be consumed due to over-etching, thereby causing weak points. In the case, during the subsequent heat treatment of BEOL, the copper layer under the via breaks out along weak points to result in the copper volcano defects, thereby affecting the reliability and the yield of semiconductor device.

SUMMARY OF THE INVENTION

The invention provides a semiconductor device and a method of manufacturing the same, which increases the barrier strength of the barrier layer lining the sidewall of the via by the nitridation treatment to avoid the copper volcano defects occurring, thereby improving the reliability and the yield of the device.

The invention provides a semiconductor device including a dielectric layer, a first via, a second via, a first barrier layer, and a second barrier layer. The dielectric layer has a first region and a second region. The first via is disposed in the dielectric layer in the first region. The second via is disposed in the dielectric layer in the second region. The first barrier layer lines a sidewall and a bottom surface of the first via. The second barrier layer lines a sidewall and a bottom surface of the second via. The first and second barrier layers each has an upper portion and a lower portion. The upper portion has a nitrogen doping concentration greater than a nitrogen doping concentration of the lower portion.

The invention provides a method of manufacturing a semiconductor device including: forming a plurality of vias in a dielectric layer; performing a nitridation treatment on the dielectric layer and the plurality of vias, so that a nitrogen doping concentration of a top portion of the dielectric layer is greater than a nitrogen doping concentration of a bottom portion of the dielectric layer; forming a metal-insulator-metal (MIM) stack on the dielectric layer and the plurality of vias; and patterning the MIM stack to from a MIM structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
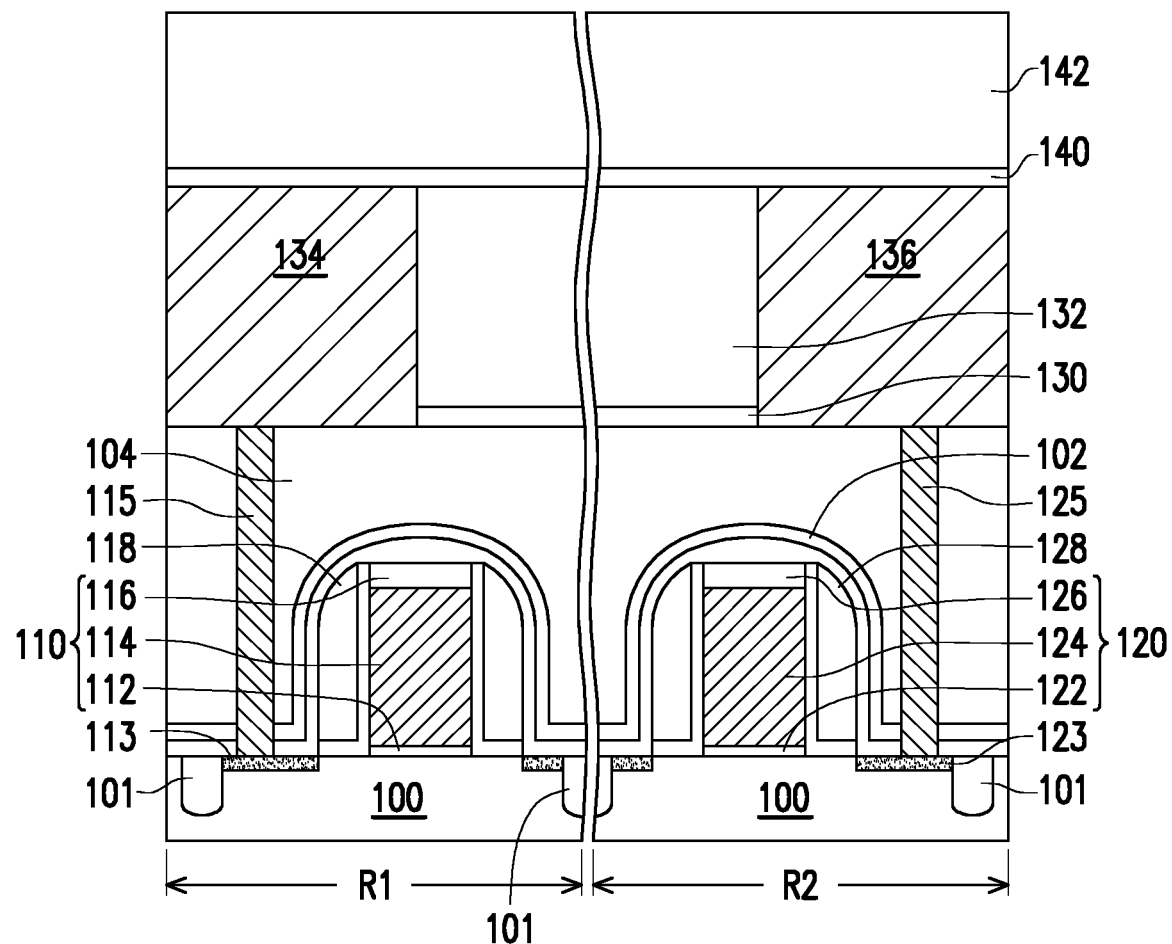
FIG. 1A to FIG. 1I are schematic cross-sectional views of a manufacturing process of a semiconductor device according to a first embodiment of the invention.

The invention is illustrated more comprehensively referring to the drawings of the embodiments. However, the invention may be embodied in many different forms and should not be construed as limited to the embodiments set forth herein. Thicknesses of layers and regions in the drawings may be enlarged for clarity. Wherever possible, the same or similar reference numbers are used in the drawings and the description to refer to the same or similar components, and are not repeated again in the following paragraphs.

Figure 1B:
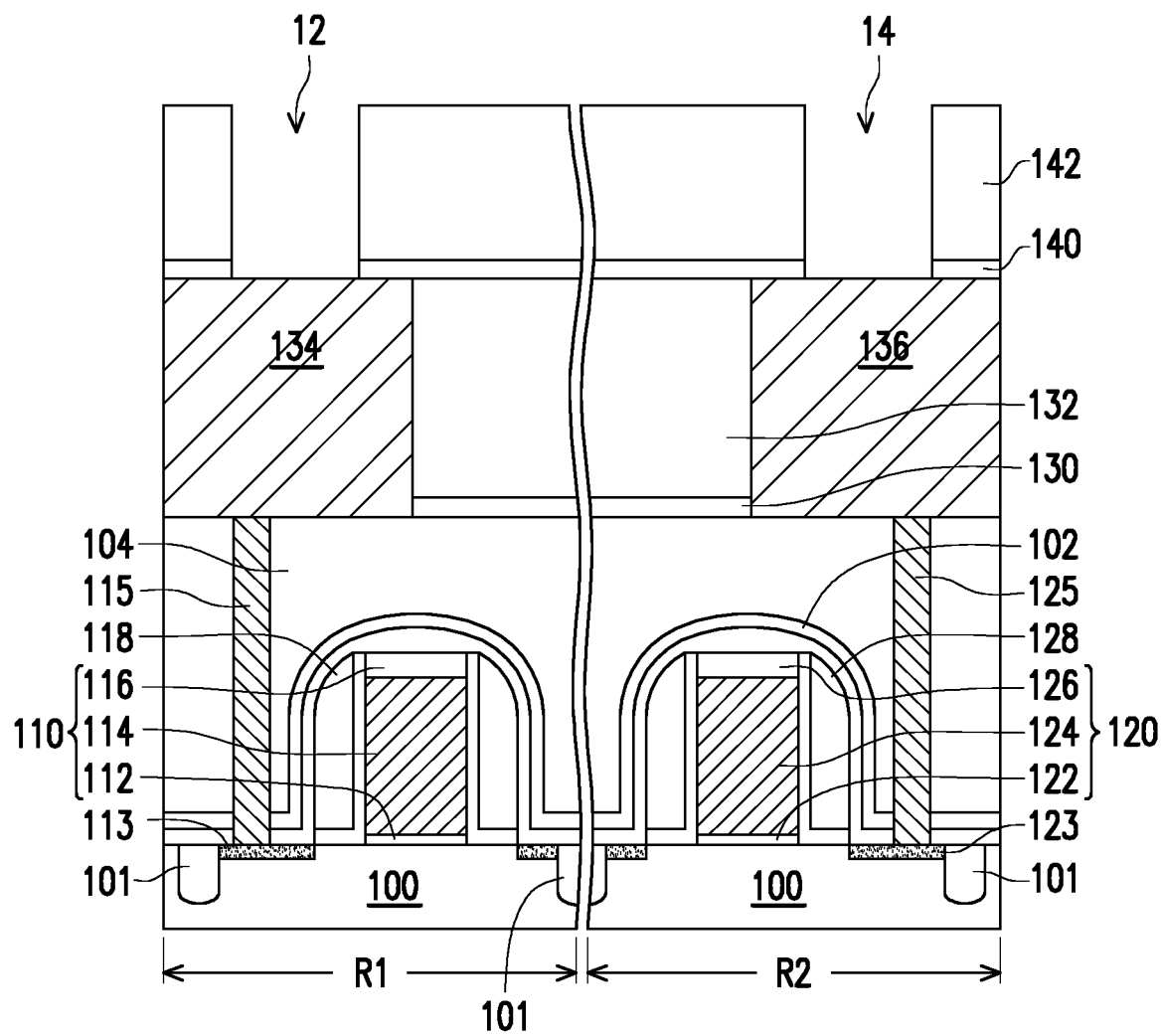
Figure 1C:
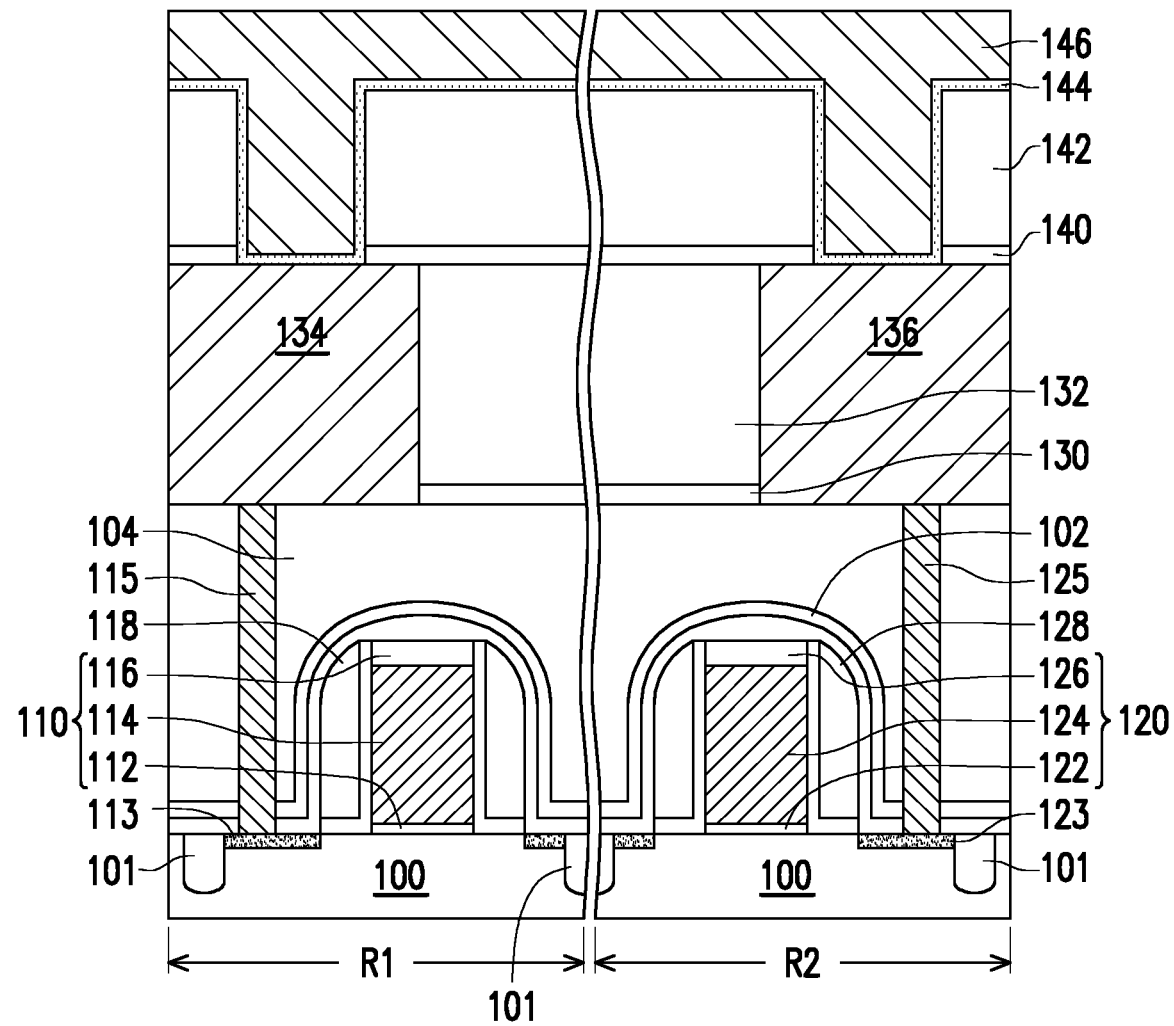
Figure 1D:
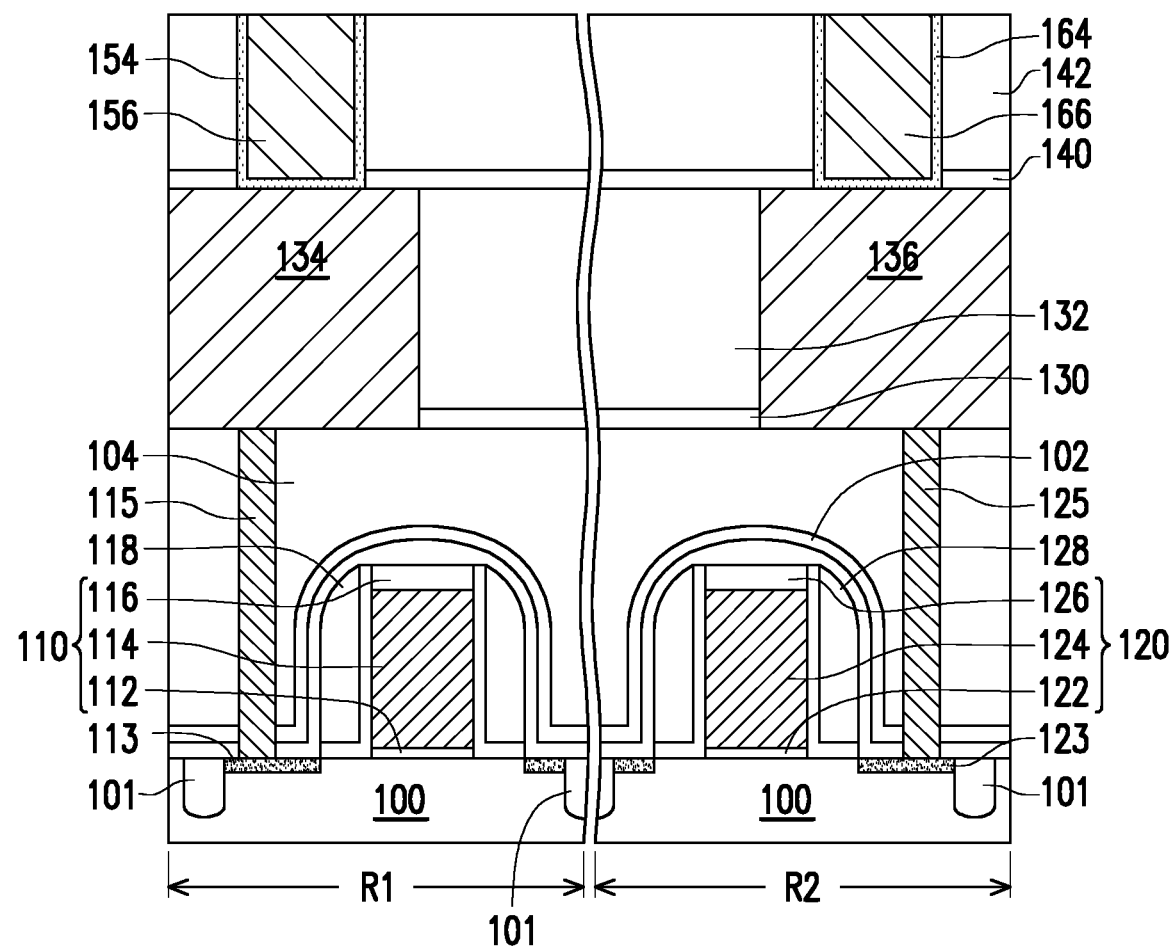
Figure 1E:
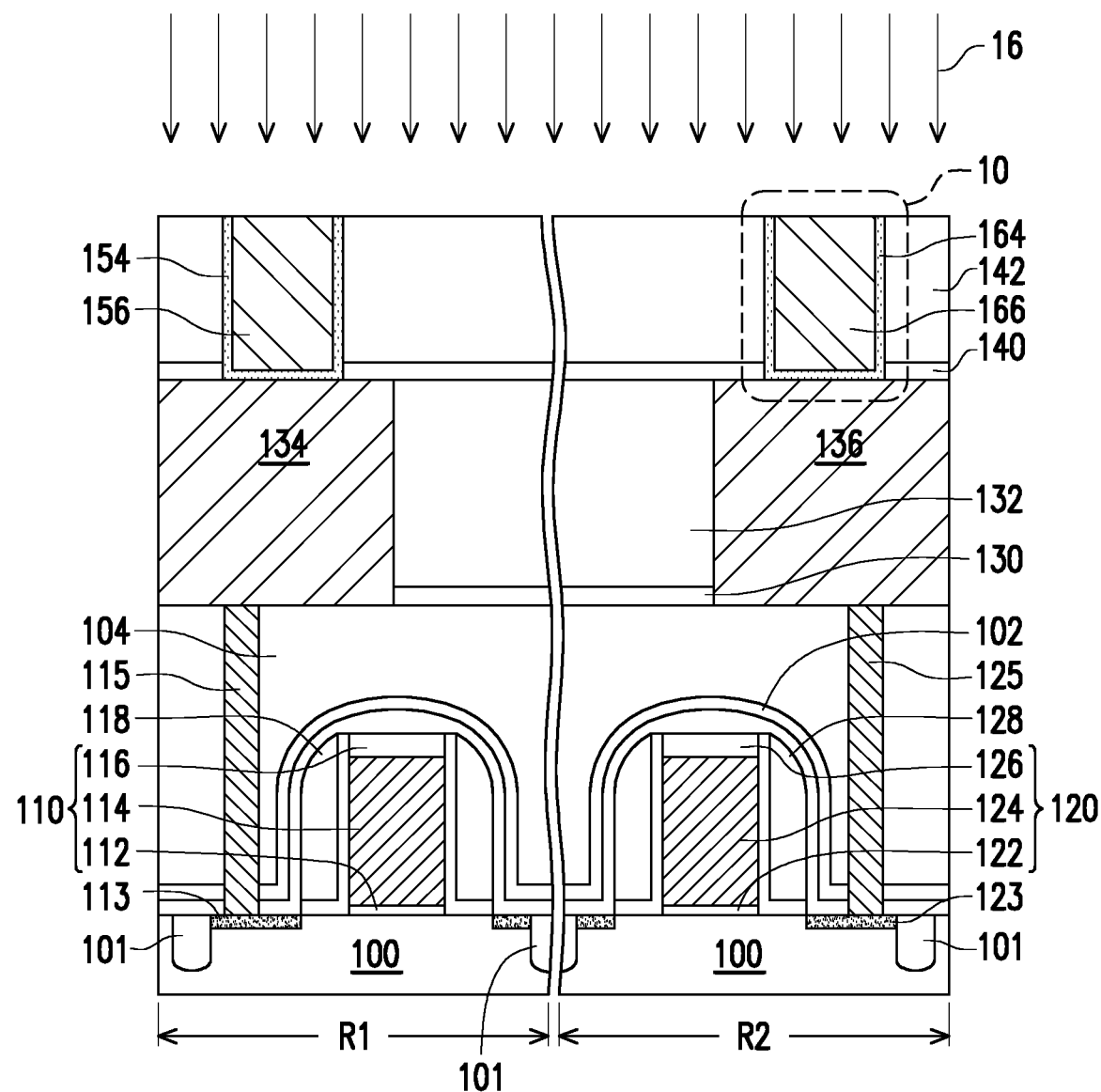
Figure 1F:
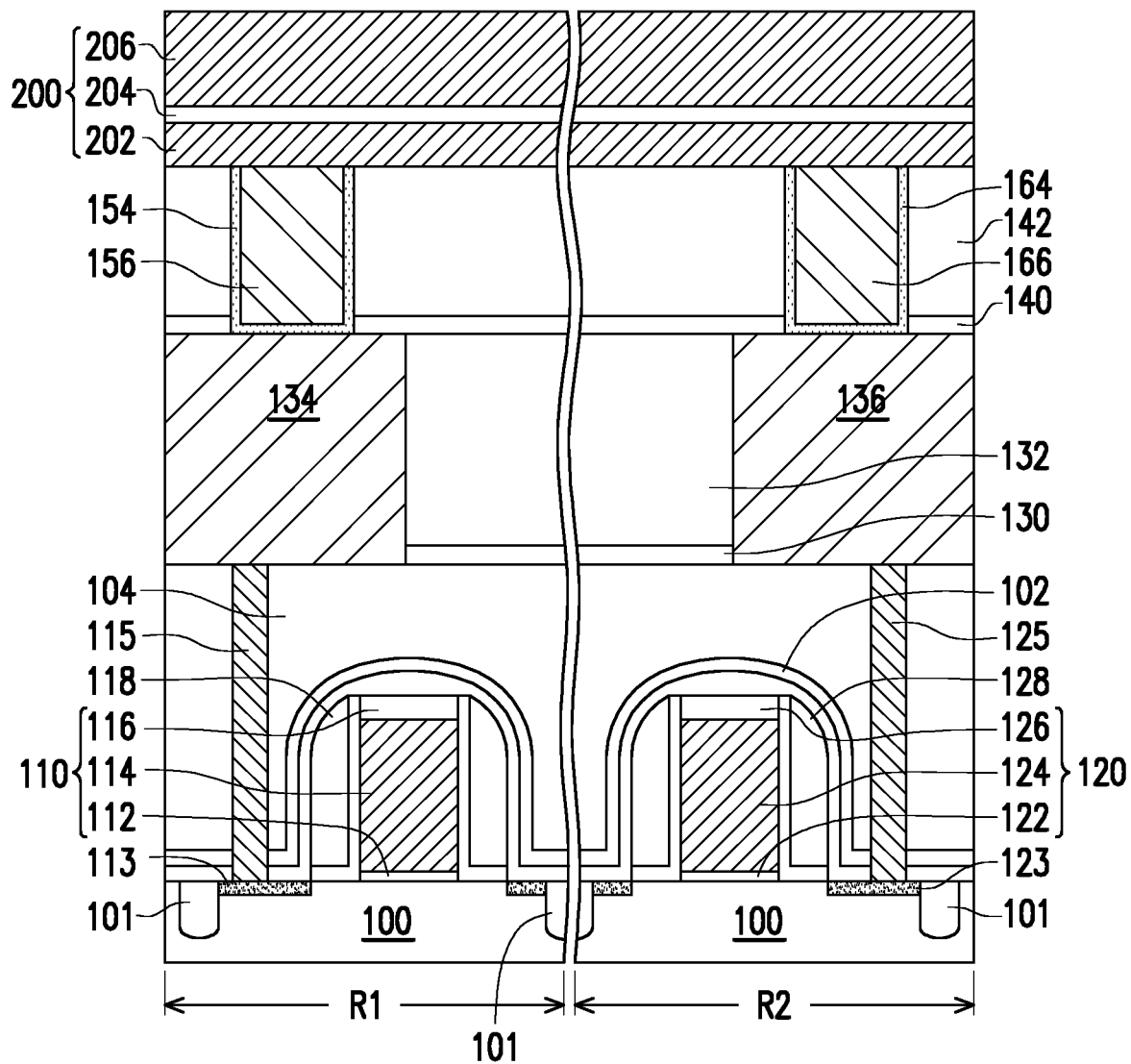
Figure 1G:
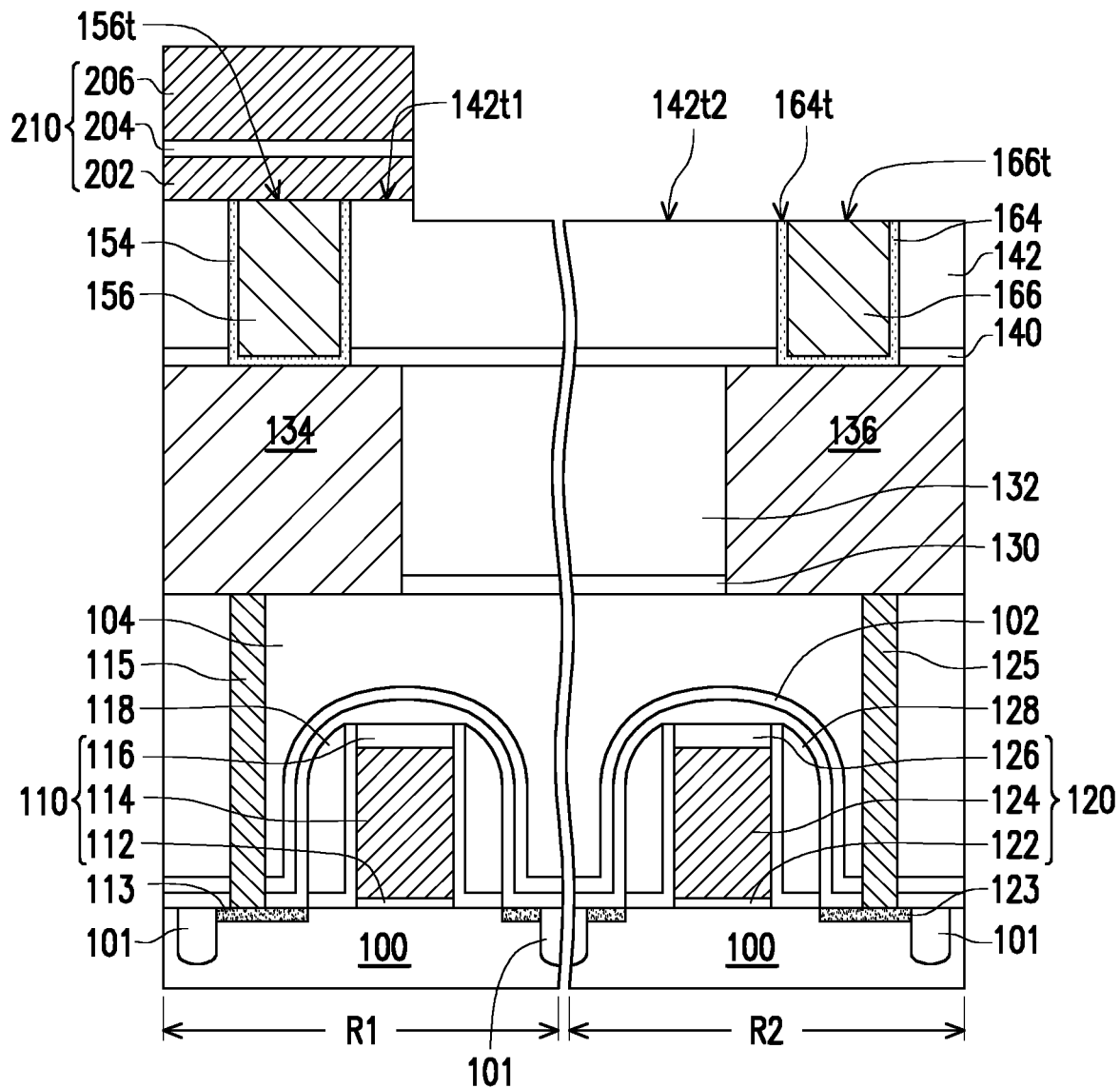
Figure 1H:
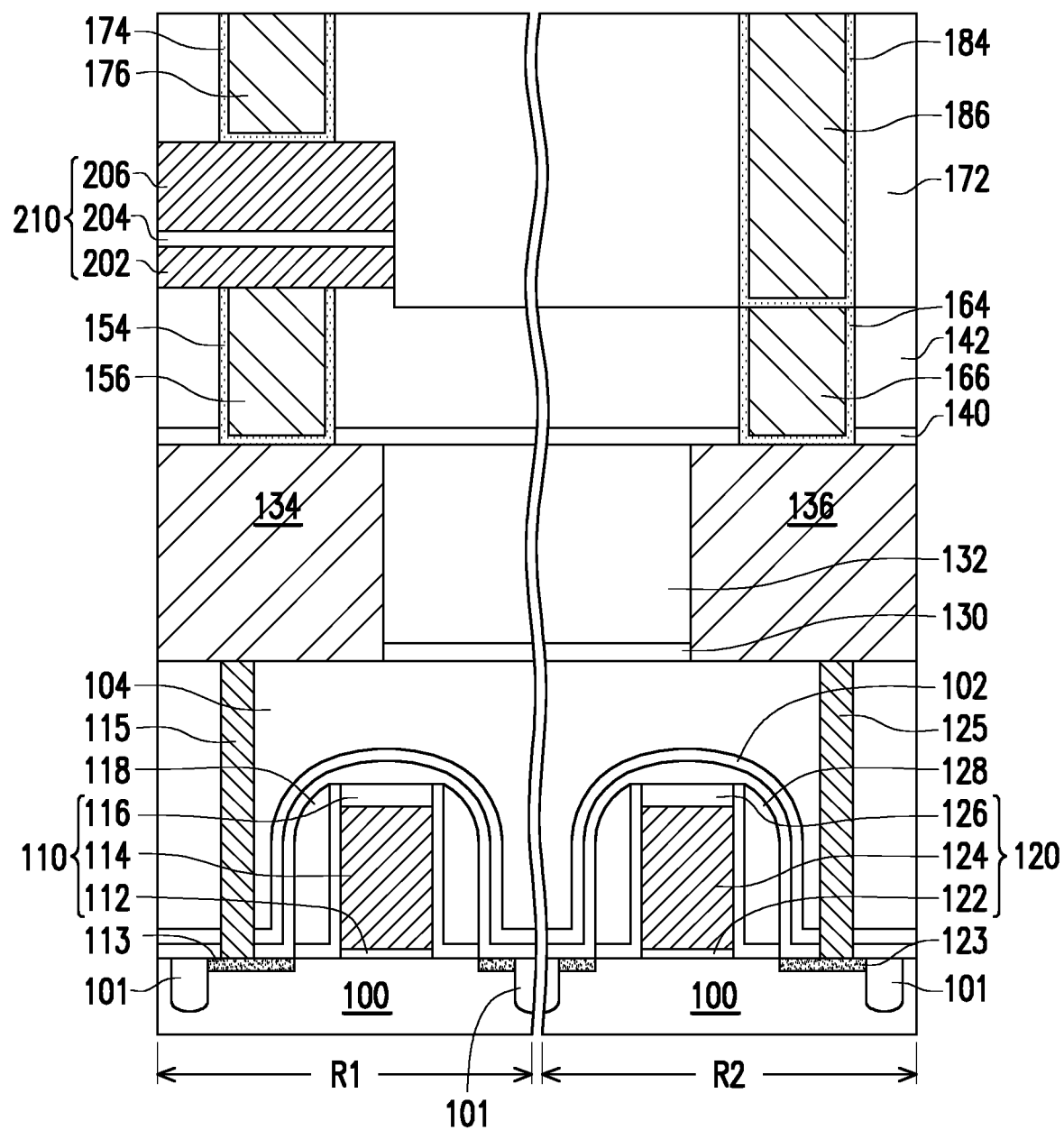
Figure 1I:
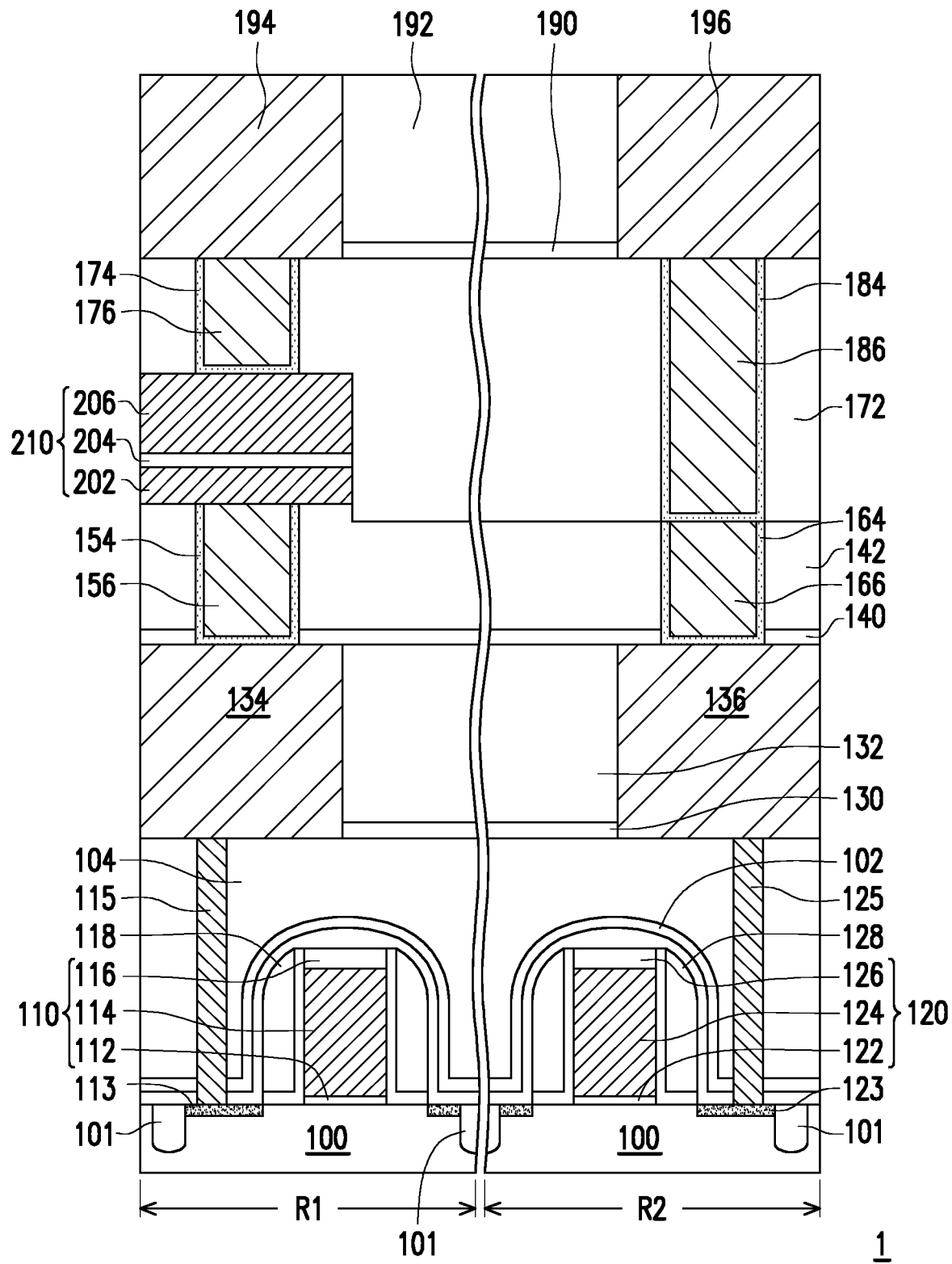

The first embodiment of the present invention provides a manufacturing process of a semiconductor device 1 (as shown in FIG. 1I), and the detailed steps are shown in FIG. 1A to FIG. 1I. First, referring to FIG. 1A, an initial structure including a substrate 100, an isolation structure 101, gate structures 110 and 120, contacts 115 and 125, dielectric layers 130 and 132, conductive layers 134 and 136, and dielectric layer 140 and 142 is provided. Specifically, the substrate 100 includes a first region R1 and a second region R2. In some embodiments, the first region R1 is a memory cell region, and the second region R2 is a peripheral region. The first region R1 may have a plurality of memory cells arranged as a memory array. The second region R2 may have peripheral circuits.

The gate structure 110 is disposed on the substrate 100 in the first region R1. In some embodiments, the gate structure 110 includes a gate dielectric layer 112, a gate electrode 114, and a cap layer 116. The gate electrode 114 is disposed between the gate dielectric layer 112 and the cap layer 116. A pair of spacers 118 are disposed on the sidewalls of the gate structure 110. In addition, the gate structure 120 is disposed on the substrate 100 in the second region R2. In some embodiments, the gate structure 120 includes a gate dielectric layer 122, a gate electrode 124 and a cap layer 126. The gate electrode 124 is disposed between the gate dielectric layer 122 and the cap layer 126. A pair of spacers 128 are disposed on the sidewalls of the gate structure 120. In some embodiments, the spacers 118 and 128 include a single-layered structure or a multi-layered structure. Further, the isolation structure 101 is disposed in the substrate 100 to separate the gate structure 110 from the gate structure 120 and/or other transistors.

As shown in FIG. 1A, the initial structure further includes an etching stop layer 102 and a dielectric layer 104. The etching stop layer 102 conformally covers the substrate 100 and the gate structures 110, 120. The dielectric layer 104 is disposed on the etching stop layer 102. In some embodiments, the dielectric layer 104 may be referred to as an interlayer dielectric (ILD) layer. The etching stop layer 102 and the dielectric layer 104 have different dielectric materials. For example, a material of the etching stop layer 102 includes silicon nitride, and a material of the dielectric layer 104 includes high-density-plasma (HDP) oxide. In some embodiments, the etching stop layer 102 may include a single-layered structure or a multi-layered structure. The contacts 115 and 125 penetrate through the dielectric layer 104 and the etching stop layer 102, and are electrically connected to the doped regions (e.g., S/D regions) in the substrate 100 through the silicide layers 113 and 123, respectively.

The dielectric layers 130, 132 and the conductive layers 134, 136 are respectively disposed on the dielectric layer 104. In some embodiments, the dielectric layer 132 may be referred to as an inter-metal dielectric (IMD) layer. The dielectric layer 130 may be used as an etching stop layer, which has a dielectric material different from the dielectric layer 132. For example, a material of the dielectric layer 130 includes silicon nitride, and a material of the dielectric layer 132 includes tetraethoxysilane (TEOS) oxide. The conductive layers 134 and 136 are embedded in the dielectric layers 130 and 132 to be electrically connected to the contacts 115 and 125 respectively. In some embodiments, the conductive layers 134, 136 may be circuit layers. A material of the conductive layers 134 and 136 include a metal material, such as copper layers.

As shown in FIG. 1A, the dielectric layers 140 and 142 are disposed on the dielectric layers 130, 132 and the conductive layers 134, 136. In some embodiments, the underlying dielectric layer 140 is used as an etching stop layer, which has a dielectric material different from the overlying dielectric layer 142. For example, a material of the dielectric layer 140 includes SiCN, and a material of the dielectric layer 142 includes HDP oxide.

Referring to FIG. 1B, a first opening 12 and a second opening 14 are formed in the dielectric layers 140 and 142. The first opening 12 is located in the dielectric layers 140 and 142 of the first region R1 and exposes a portion of the top surface of the conductive layer 134. The second opening 14 is located in the dielectric layers 140 and 142 of the second region R2 and exposes a portion of the top surface of the conductive layer 136.

Referring to FIG. 1C, a barrier material 144 is formed to conformally cover the first opening 12 and the second opening 14, and extend to cover the top surface of the dielectric layer 142. In some embodiments, the barrier material 144 includes Ti, TiN, Ta, TaN, or a combination thereof, which may be formed by chemical vapor deposition (CVD) or physical vapor deposition (PVD). Next, a conductive material 146 is formed on the barrier material 144. The conductive material 146 fills up the first opening 12 and the second opening 14, and extends to cover the top surface of the dielectric layer 142. In some embodiments, the conductive material 146 includes a metal material (e.g., tungsten), which can be formed by CVD or PVD.

Referring to FIG. 1D, a planarization process is performed to remove a portion of the conductive material 146 and a portion of the barrier material 144, so as to form a first barrier layer 154 and a first via 156 in the first opening 12, and form a second barrier layer 164 and a second via 166 in the second opening 14. Specifically, the first barrier layer 154 is lined on a sidewall and a bottom surface of the first via 156 to separate the first via 156 from the dielectric layers 140 and 142. Herein, the so-called "lined" refers to conformally cover. That is, the first barrier layer 154 conformally covers the sidewall and the bottom surface of the first via 156. On the other hand, the second barrier layer 164 is lined on a sidewall and a bottom surface of the second via 166 to separate the second via 166 from the dielectric layers 140 and 142. In some embodiments, the planarization process may be a chemical mechanical polishing (CMP) process. After the planarization process, the top surface of the first barrier layer 154, the top surface of the first via 156, the top surface of the second barrier layer 164, the top surface of the second via 166, and the top surface of the dielectric layer 142 may be referred to as coplanar.

Referring to FIG. 1E, a nitridation treatment 16 is performed on the first barrier layer 154, the first via 156, the second barrier layer 164, the second via 166, and the dielectric layer 142. In some embodiments, the nitridation treatment 16 includes performing a plasma nitridation process. The plasma nitridation process includes introducing a nitrogen-containing gas, such as $N_2$, $NH_3$, or a combination thereof. The process temperature of the plasma nitridation process may be between 300° C. and 400° C., such as 350° C.; and the process time of the plasma nitridation process may be between 30 seconds and 300 seconds, such as 30 seconds. After performing the nitridation treatment 16, as shown in a region 10 of the enlarged view of FIG. 2, the dielectric layer 142 is divided into a bottom portion 142a and a top portion 142b, and the second barrier layer 164 is also divided into a lower portion 164a and an upper portion 164b. The bottom portion 142a surrounds the lower portion 164a, and the top portion 142b surrounds the upper portion 164b. In some embodiments, a nitrogen doping concentration of the top portion 142b of the dielectric layer 142 is greater than a nitrogen doping concentration of the bottom portion 142a of the dielectric layer 142. A ratio (N1/N2) of the nitrogen doping concentration (N1) of the top portion 142b of the dielectric layer 142 to the nitrogen doping concentration (N2) of the bottom portion 142a of the dielectric layer 142 may be in a range of 1 to 3. A nitrogen doping concentration of the upper portion 164b of the second barrier layer 164 is greater than a nitrogen doping concentration of the lower portion 164a of the second barrier layer 164. A ratio (N3/N4) of the nitrogen doping concentration (N3) of the upper portion 164b of the second barrier layer 164 to the lower portion 164a (N4) of the second barrier layer 164 may be in a range of 2 to 10. Similarly, the first barrier layer 154 is also divided into a lower portion and an upper portion (not shown), a nitrogen doping concentration of the upper portion of the first barrier layer 154 is also greater than a nitrogen doping concentration of the lower portion of the first barrier layer 154. It should be noted that the nitridation treatment 16 is able to increase or reinforce the barrier strength of the upper portion 164b of the second barrier layer 164 to avoid the weak points causing during the MIM stack is subsequent patterned, thereby reducing the occurrence of copper volcano defects.

Figure 2:
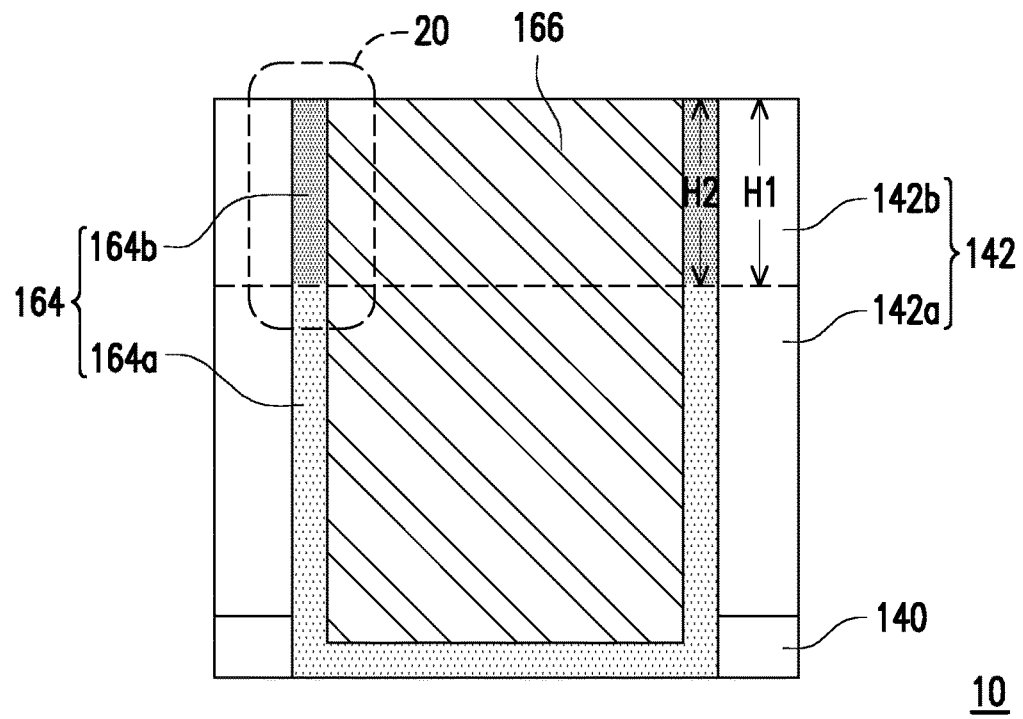
FIG. 2 is an enlarged view of a region of FIG. 1E.

As shown in FIG. 2, the top portion 142b of the dielectric layer 142 has a height H1. In some embodiments, the height H1 may be between 5 nm and 15 nm. However, the invention is not limited thereto, in other embodiments, the height H1 may be adjusted by changing the treatment time of the nitridation treatment 16. For example, as the processing time of the nitride treatment 16 increases, the height H1 also increases. In addition, the upper portion 164b of the second barrier layer 164 has a height H2. In some embodiments, the height H2 may be between 5 nm and 15 nm. Although the height H1 and the height H2 shown in FIG. 2 are the same, the present invention is not limited thereto, in other embodiments, the height H1 may be different from the height H2. For example, the height H2 of the upper portion 164b of the second barrier layer 164 is greater than the height H1 of the top portion 142b of the dielectric layer 142. In the case, a portion of the bottom portion 142a of the dielectric layer 142 also surrounds a portion of the upper portion 164*b* of the second barrier layer 164.

Figure 3:
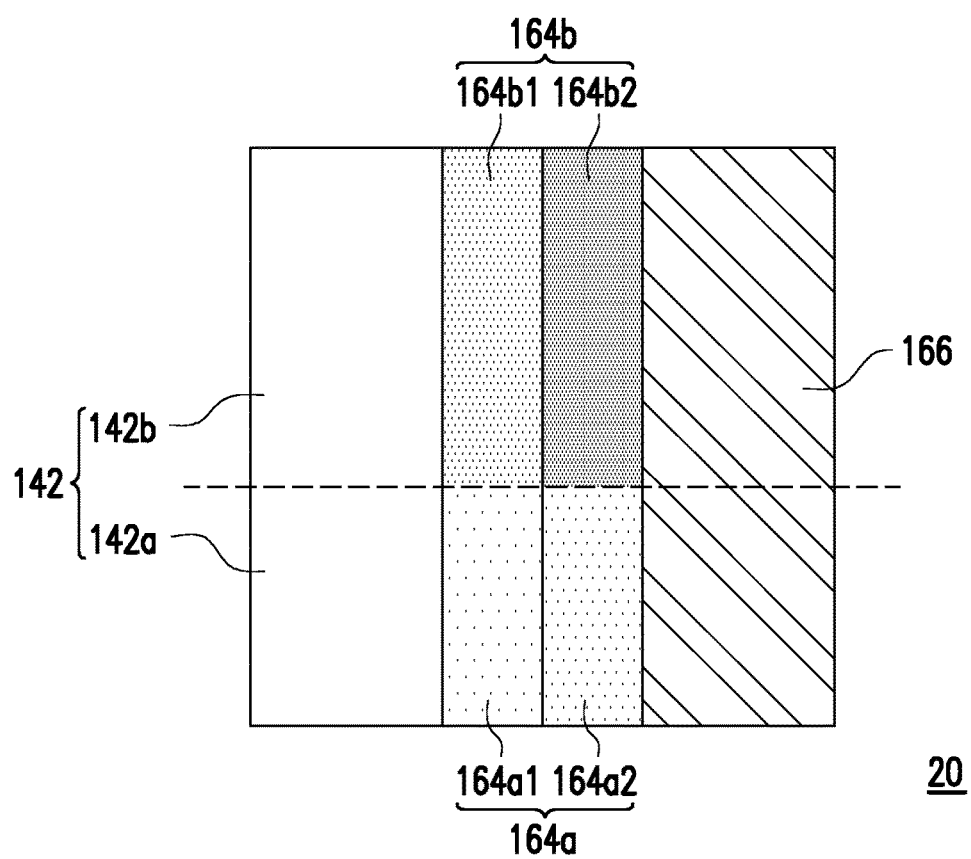
FIG. 3 is an enlarged view of a region of FIG. 2 according to another embodiment.

In the present embodiment, the second barrier layer 164 may be a bi-layered structure, such as a Ti layer and a TiN layer. After the nitridation treatment 16, as shown in a region 20 of the enlarged view of FIG. 3, the lower portion 164*a* includes a Ti layer 164*a*1 contacting the dielectric layer 142 and a TiN layer 164*a*2 contacting the second via 166; and the upper portion 164*b* includes a Ti layer 164*b*1 contacting the dielectric layer 142 and a TiN layer 164*b*2 contacting the second via 166. A nitrogen doping concentration of the Ti layer 164*b*1 of the upper portion 164*b* may be greater than a nitrogen doping concentration of the Ti layer 164*a*1 of the lower portion 164*a*. From another perspective, the Ti layer 164*b*1 of the upper portion 164*b* may be doped as a TiN layer, while the Ti layer 164*a*1 of the lower portion 164*a* remains as the Ti layer. In addition, a nitrogen doping concentration of the TiN layer 164*b*2 of the upper portion 164*b* may also be greater than a nitrogen doping concentration of the TiN layer 164*a*2 of the lower portion 164*a*.

Referring to FIG. 1F, a metal-insulator-metal (MIM) stack 200 is formed on the dielectric layer 142, the first via 156, and the second via 166. Specifically, the MIM stack 200 includes two metal layers 202, 206 and an insulating layer 204 sandwiched between the metal layers 202, 206. In some embodiments, a material of the metal layers 202, 206 may include Ti, TiN, or a combination thereof. For example, the metal layers 202 and 206 may be a bi-layered structure, such as a Ti layer and a TiN layer on the Ti layer.

Referring to FIG. 1F and FIG. 1G, the MIM stack 200 is patterned to form a MIM structure 210 on the first region R1. The MIM structure 210 is formed on the first via 156 to be electrically connected to the first via 156. The second via 166 is exposed to the MIM structure 210. In the embodiment, during the patterning the MIM stack 200, in order to completely remove the MIM stack 200 on the second region R2, the dielectric layer 142, the second barrier layer 164, and the second via 166 are further recessed, so that a top surface 142*t*2 of the dielectric layer 142 in the second region R2 is lower than a top surface 142*t*1 of the dielectric layer 142 in the first region R1, and a top surface 166*t* of the second via 166 is lower than a top surface 156*t* of the first via 156. It should be noted that the nitrogen-doped second barrier layer 164 is able to effectively block the etchant containing chlorine (Cl) used in the patterning MIM stack 200, thereby avoiding the loss of the second barrier layer 164. Therefore, during the subsequent heat treatment of BEOL, the conductive layer 136 under the second via 166 will not generate the copper volcano defects along the second barrier layer 164, thereby improving the reliability and the yield of the semiconductor device of the present invention. In some embodiments, the top surface 164*t* of the second barrier layer 164 may be flush with the top surface 166*t* of the second via 166 and the top surface 142*t*2 of the dielectric layer 142 in the second region R2.

In some embodiments, the MIM structure 210 may be a memory structure, a capacitor structure, a resistor structure, or a combination thereof. The memory structure includes a resistive random access memory (RRAM), a magnetic random access memory (MRAM), a phase change random access memory (PCRAM), a ferroelectric random access memory (FeRAM), or a combination thereof. For example, when the MIM structure 210 is the RRAM, the insulating layer 204 is a variable resistance layer that can change its own resistance through the applied voltage. The insulating layer 204 may include a high dielectric constant (high-k) dielectric material, which may be at least one oxide material selected from the group consisting of $TiO_2$, NiO, HfO, $HfO_2$, ZrO, $ZrO_2$, $Ta_2O_5$, ZnO, $WO_3$, CoO, and $Nb_2O_5$.

Referring to FIG. 1H, a dielectric layer 172 is formed on the MIM structure 210 and the dielectric layer 142. In some embodiments, a material of the dielectric layer 172 includes HDP oxide. Next, vias 176 and 186 are formed in the dielectric layer 172, respectively. The via 176 penetrates through a portion of the dielectric layer 172 to land on the MIM structure 210. The barrier layer 174 is lined on a sidewall and a bottom surface of the via 176 to separate the via 176 from the dielectric layer 172. On the other hand, the via 186 (also called third via) penetrates through the dielectric layer 172 to land on the first via 156. The barrier layer 184 is lined on a sidewall and a bottom surface of the via 186 to separate the via 186 from the dielectric layer 172.

Referring to FIG. 1I, dielectric layers 190 and 192 are formed on the dielectric layer 172 and the vias 176, 186. In some embodiments, the dielectric layer 192 may be regarded as an inter-metal dielectric (IMD) layer. The dielectric layer 190 may be used as an etching stop layer, which has a dielectric material different from the dielectric layer 192. For example, a material of the dielectric layer 190 includes silicon nitride, and a material of the dielectric layer 192 includes TEOS oxide. Next, conductive layers 194 and 196 are respectively formed in the dielectric layers 190 and 192 to accomplish the semiconductor device 1. The conductive layers 194 and 196 are embedded in the dielectric layers 190 and 192 to be electrically connected to the vias 176 and 186, respectively. In some embodiments, the conductive layers 194, 196 may be circuit layers. A material of the conductive layers 194 and 196 includes a metal material, such as copper layers.

Figure 4:
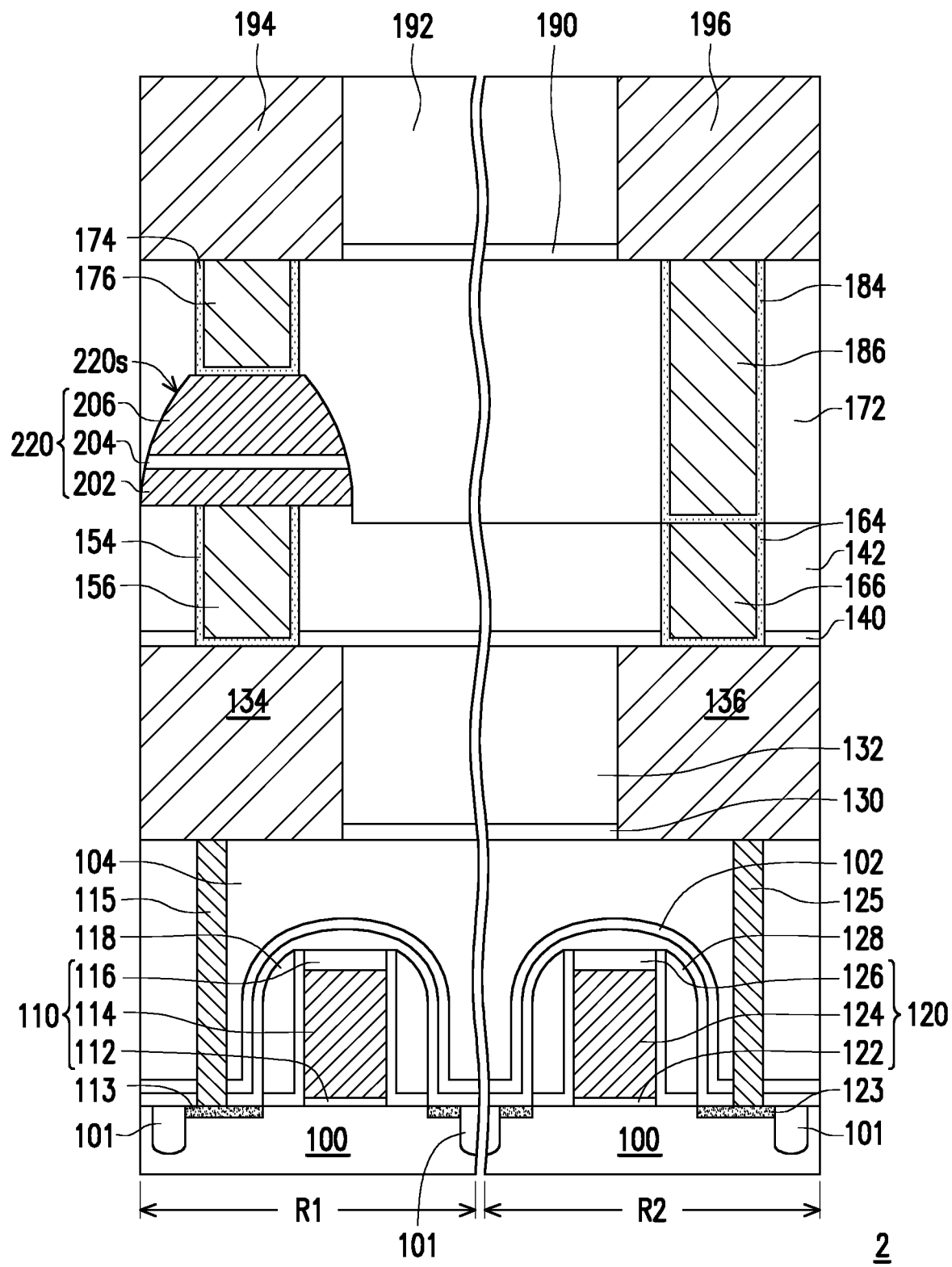
FIG. 4 is a schematic cross-sectional view of a semiconductor device according to a second embodiment of the invention.

Referring to FIG. 4, a semiconductor device 2 of the second embodiment is generally similar to the semiconductor element 1 of the first embodiment. The main difference between the two is that the MIM structure 220 of the semiconductor device 2 has a curved sidewall 220*s*. As shown in FIG. 4, the sidewall 220*s* of the MIM structure 220 is tapered along the upward direction of the substrate 100. In some embodiments, the lower width and/or the lower area of the MIM structure 220 may be greater than the upper width and/or the upper area of the MIM structure 220.

In summary, in the embodiment of the present invention, the barrier strength of the barrier layer lined on the sidewall of the via is increased by the nitridation treatment, so as to avoid the weak points causing during the MIM stack is subsequent patterned, thereby reducing the occurrence of copper volcano defects. As such, the embodiments of the present invention can effectively improve the reliability and the yield of the semiconductor device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor device, comprising:
   a dielectric layer, having a first region and a second region;
   a first via, disposed in the dielectric layer in the first region;
   a second via, disposed in the dielectric layer in the second region;
   a first barrier layer, lining a sidewall and a bottom surface of the first via; and a second barrier layer, lining a sidewall and a bottom surface of the second via, wherein the first and second vias each has an upper portion and a lower portion, and the upper portion has a nitrogen doping concentration greater than a nitrogen doping concentration of the lower portion.

2. The semiconductor device according to claim 1, wherein the dielectric layer comprises:
   a bottom portion surrounding the lower portion of the second barrier layer; and
   a top portion surrounding the upper portion of the second barrier layer, wherein the top portion has a nitrogen doping concentration greater than a nitrogen doping concentration of the bottom portion.

3. The semiconductor device according to claim 1, further comprising:
   a metal-insulator-metal (MIM) structure, disposed on the first via; and
   a third via, disposed on the second via.

4. The semiconductor device according to claim 3, wherein the MIM structure comprises a memory structure, a capacitor structure, a resistor structure, or a combination thereof.

5. The semiconductor device according to claim 4, wherein the memory structure comprises a resistive random access memory (RRAM), a magnetic random access memory (MRAM), a phase change random access memory (PCRAM), a ferroelectric random access memory (FeRAM), or a combination thereof.

6. The semiconductor device according to claim 3, wherein the second via has a top surface lower than a top surface of the first via.

7. The semiconductor device according to claim 3, wherein a top surface of the dielectric layer in the second region is lower than a top surface of the dielectric layer in the first region.

8. The semiconductor device according to claim 3, wherein a top surface of the dielectric layer in the second region is substantially flush with a top surface of the second barrier layer.

9. The semiconductor device according to claim 3, wherein the MIM structure has a curved sidewall.

10. The semiconductor device according to claim 1, wherein the first region is memory cell region, and the second region is a periphery region.

11. A method of manufacturing a semiconductor device, comprising:
    forming a plurality of vias in a dielectric layer;
    performing a nitridation treatment on the dielectric layer and the plurality of vias, so that a nitrogen doping concentration of a top portion of the dielectric layer is greater than a nitrogen doping concentration of a bottom portion of the dielectric layer;
    forming a metal-insulator-metal (MIM) stack on the dielectric layer and the plurality of vias; and
    patterning the MIM stack to from a MIM structure.

12. The method according to claim 11, wherein the performing the nitridation treatment comprises performing a plasma nitridation process, the plasma nitridation process comprises introducing a nitrogen-containing gas, and the nitrogen-containing gas comprises $N_2$, $NH_3$, or a combination thereof.

13. The method according to claim 11, wherein the dielectric layer has a first region and a second region, the first region is memory cell region, and the second region is a periphery region.

14. The method according to claim 13, wherein the forming the plurality of vias in the dielectric layer comprises:
    forming a first opening in the dielectric layer of the first region;
    forming a second opening in the dielectric layer of the second region;
    conformally forming a barrier material to cover the first and second openings;
    forming a conductive material on the barrier material to fill up the first and second openings and cover a top surface of the dielectric layer; and
    performing a planarization process to form a first via in the first opening, and form a second via in the second opening, wherein a first barrier layer is lined on a sidewall and a bottom surface of the first via, and a second barrier layer is lined on a sidewall and a bottom surface of the second via.

15. The method according to claim 14, wherein after performing the nitridation treatment, the first and second barrier layers each has an upper portion and a lower portion, the bottom portion of the dielectric layer surrounds the lower portion, the top portion of the dielectric layer surrounds the upper portion, and the upper portion has a nitrogen doping concentration greater than a nitrogen doping concentration of the lower portion.

16. The method according to claim 14, wherein after patterning the MIM stack, the second via is further recessed, so that a top surface of the second via is lower than a top surface of the first via.

17. The method according to claim 14, wherein after patterning the MIM stack, the MIM structure is formed on the first via, and the second via is exposed to the MIM structure.

18. The method according to claim 13, wherein after patterning the MIM stack, the dielectric layer in the second region is further recessed, so that a top surface of the dielectric layer in the second region is lower than a top surface of the dielectric layer in the first region.

19. The method according to claim 11, wherein the MIM structure comprises a memory structure, a capacitor structure, a resistor structure, or a combination thereof.

20. The method according to claim 19, wherein the memory structure comprises a resistive random access memory (RRAM), a magnetic random access memory (MRAM), a phase change random access memory (PCRAM), a ferroelectric random access memory (FeRAM), or a combination thereof.

* * * * *